United States Patent
Higashi et al.

(10) Patent No.: US 6,905,920 B2
(45) Date of Patent: Jun. 14, 2005

(54) METHOD FOR FABRICATION OF FIELD-EFFECT TRANSISTOR TO REDUCE DEFECTS AT MOS INTERFACES FORMED AT LOW TEMPERATURE

(75) Inventors: Seiichiro Higashi, Chino (JP); Daisuke Abe, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/945,247

(22) Filed: Aug. 31, 2001

(65) Prior Publication Data

US 2002/0043691 A1 Apr. 18, 2002

(30) Foreign Application Priority Data

Sep. 4, 2000 (JP) .................................... 2000-267286
Aug. 31, 2001 (JP) .................................... 2001-263559

(51) Int. Cl.$^7$ .................... H01L 21/336; H01L 21/8234
(52) U.S. Cl. .................. 438/197; 438/46; 438/289; 438/486; 438/795
(58) Field of Search .................... 438/46, 197, 289, 438/486, 795

(56) References Cited

U.S. PATENT DOCUMENTS

| | | | | |
|---|---|---|---|---|
| 4,889,817 A | * | 12/1989 | Saito et al. ................. 438/17 |
| 5,424,244 A | * | 6/1995 | Zhang et al. ............... 438/301 |
| 5,498,557 A | * | 3/1996 | Negishi et al. ............. 438/158 |
| 5,627,084 A | * | 5/1997 | Yamazaki et al. .......... 438/166 |
| 5,970,384 A | * | 10/1999 | Yamazaki et al. .......... 438/795 |
| 6,096,641 A | * | 8/2000 | Kunikiyo .................... 438/653 |
| 6,208,002 B1 | * | 3/2001 | Satake et al. ............... 257/410 |
| 6,245,618 B1 | * | 6/2001 | An et al. .................... 438/289 |
| 6,261,877 B1 | * | 7/2001 | Yamazaki et al. .......... 438/151 |
| 6,300,239 B1 | * | 10/2001 | Ono ........................... 438/633 |
| 6,380,573 B1 | * | 4/2002 | Tamura ...................... 257/295 |
| 6,653,212 B1 | * | 11/2003 | Yamanaka et al. ......... 438/485 |
| 2001/0010941 A1 | * | 8/2001 | Morita ........................ 438/46 |
| 2002/0024863 A1 | * | 3/2002 | Yamazaki et al. .......... 438/486 |
| 2002/0030234 A1 | * | 3/2002 | Chuchi et al. .............. 257/383 |
| 2002/0037442 A1 | * | 3/2002 | Grill et al. .................. 428/698 |
| 2003/0122131 A1 | * | 7/2003 | Zhang et al. ................ 257/72 |
| 2004/0070045 A1 | * | 4/2004 | Suguro et al. .............. 257/506 |

FOREIGN PATENT DOCUMENTS

JP        06-232402        8/1994

* cited by examiner

*Primary Examiner*—Amir Zarabian
*Assistant Examiner*—Ida M. Soward
(74) *Attorney, Agent, or Firm*—Harness, Dickey & Pierce, P.L.C.

(57) ABSTRACT

A method for the fabrication of a field-effect transistor wherein after forming a semiconductor layer serving as an active layer on a substrate, the substrate temperature is set at no higher than 100° C., a gate insulating film is formed on the semiconductor layer. Then, the gate insulating film is heat treated in an atmosphere containing water. By heat treating in the atmosphere containing water, OH bonds in the vicinity of the insulating film interface are reduced and, therefore, the CV characteristic thereof is improved.

16 Claims, 7 Drawing Sheets

METHOD FOR FABRICATION OF FIELD-EFFECT TRANSISTOR TO REDUCE DEFECTS AT MOS INTERFACES FORMED AT LOW TEMPERATURE

BACKGROUND OF THE INVENTION

1. Field of Technology

The present invention relates to a method for the fabrication of thin-film transistors employed as elements which are formed on a single-crystal substrate, for example, field-effect transistors, thin-film transistors formed on an insulator, logic circuits formed therefrom, and a structural component of display drive circuits or display pixels used in electronic apparatuses such as memory circuits, liquid-crystal displays, and organic EL displays.

2. Description of the Related Art

Semiconductor films such as polycrystalline silicon films have been widely used in thin-film transistors (abbreviated as TFT hereinbelow) or solar cells. In particular, polycrystalline silicon (poly-Si) TFT can be produced on a transparent insulating substrate such as glass substrate, while allowing for increased mobility. Polycrystalline silicon TFTs have been widely used as light modulating elements, for example, in liquid-crystal displays (LCD) or liquid-crystal projectors or as structural elements of internal drivers for liquid-crystal drive and have successfully emerged into new fields of application, demonstrating there the above-described merits. A fabrication method termed as a high-temperature process has already found application for the manufacture of high-performance TFT on a glass substrate. The high-temperature process is one of the processes for TFT fabrication, which uses a high temperature of about 1000° C. The high-temperature process has advantages of: allowing for the production of polycrystalline silicon of comparatively good quality by solid-phase growth of silicon; and allowing for the formation of a good gate insulating film (typically silicon dioxide) and a clean polycrystalline silicon—gate insulating film interface by thermal oxidation. Those advantages of the high-temperature process make it possible to fabricate a high-performance TFT having high mobility and reliability with good stability.

However, for a substrate where a TFT is produced to be suitable for the high-temperature process it has to withstand high-temperature processing at a temperature of no less than 1000° C. Presently quartz glass is an appropriate material for transparent substrates satisfying this requirement. For this reason, the conventional polycrystalline silicon TFT have been fabricated on small and expensive quartz glass substrates, this process being cost ineffective and unsuitable for the transition to large-scale structures. Furthermore, since the solid-phase growth method requires long-term heat treatment (several tens of hours), the productivity is typically very low. Another problem associated with this method is that the substrate undergoes large thermal deformations because the entire substrate is subjected to long-term heating. As a result, inexpensive large glass substrates could not be used. This factor also inhibited cost reduction.

By contrast, the technology referred to as a low-temperature process resolves the above-described drawbacks inherent to the high-temperature process and allows for fabrication a high-mobility polycrystalline silicon TFT. The low-temperature process is a process for the fabrication of a polycrystalline silicon TFT in which in order to use comparatively inexpensive heat-resistance glass substrates, the maximum process temperature is set to no less than about 600° C. Laser crystallization technology in which the crystallization of a silicon film is conducted by using a pulse laser with a very short generation time has been widely used in the low-temperature process. Laser crystallization is a technology employing the capability of an amorphous silicon film located on a glass substrate to be crystallized in a process of solidification after being instantaneously melted by irradiation with a high-power pulse laser beam. In recent years a technology of forming a large-area polycrystalline film by scanning an amorphous silicon film located on a glass substrate with an excimer laser beam, while repeatedly irradiating the film, has found wide application. Furthermore, a silicon dioxide ($SiO_2$) film can be formed by a film forming method using plasma CVD and the prospects for practical application of this method for growing gate insulating films are promising. The above-described methods made it possible to fabricate a polycrystalline silicon TFT on a large substrate of several tens of centimeters on a side.

However, a problem associated with the low-temperature process is that high-density interface levels appear on the interface between the semiconductor surface serving as an active layer and a gate insulating film (referred to as MOS interface hereinbelow), significantly affecting mobility and the threshold voltage of TFT. The density of interface levels at a good MOS interface obtained by thermal oxidation at a temperature of no less than 1000° C. can be decreased to about $2 \times 10^{10}$ cm$^{-2}$eV$^{-1}$, but when the insulating film was grown at a low temperature of no higher than 400° C. by plasma CVD and the like, the MOS interface level density was as high as $10^{11} \sim 10^{12}$ cm$^{-2}$eV$^{-1}$. Since the energy of those interfaces levels is in the semiconductor band, the carriers can be easily trapped.

In case of a field-effect transistor, if a voltage is applied to a gate electrode, carriers defined by the capacitance of MOS capacitor are induced at the semiconductor side. However, if defects are present at the semiconductor side, that is, at MOS interface, the induced carriers are trapped by the defects and make no contribution to conductivity. As a result, unless a higher gate voltage is applied and more carriers than defects are induced, no drain current can be obtained. This is the reason for increasing the threshold voltage of TFT. At present, there are no effective means for reliably controlling the defects. As a result, the threshold voltage of TFT is high or a large spread is obtained between the lots, which rises serious problems associated with the currently employed manufacturing processes.

At present the threshold voltage of polycrystalline silicon TFT manufactured by the low-temperature process is about 3–4 V. If the threshold voltage is increased, for example, to about 1 V, the drive voltage of circuits fabricated by using the TFT can be reduced to less than one third of the present value. Since energy consumed by a circuit is proportional to a second power of the drive voltage, the decrease of the drive voltage to less than one third will make it possible to decrease the energy consumption dose to one tenth of the present value. Therefore, it will be possible to produce liquid-crystal displays with an ultralow energy consumption suitable for displays designed for portable information devices. To attain this object, the surface density of defects in both the poly-Si and the MOS interface should be decreased to about $10^{10}$ cm$^{-2}$eV$^{-1}$.

SUMMARY OF THE INVENTION

With the foregoing in view, it is an object of the present invention to provide a method for the fabrication of a field-effect transistor which reduces defects at MOS interfaces formed by a low-temperature process and improves characteristics of circuits and polycrystalline silicon TFT.

The above-described object is attained by the present invention described below.

The present invention provides a method for the fabrication of a field-effect transistor comprising the steps of forming a semiconductor layer serving as an active layer on a substrate, setting the substrate temperature at no higher than 100° C. and forming a gate insulating film on the semiconductor layer, and heat treating the gate insulating film in an atmosphere composed of water.

"Forming a semiconductor layer serving as an active layer on a substrate" as written hereinabove includes a case in which a single-crystal substrate is formed by crystal drawing or the like.

For example, heat treatment of the gate insulating film is conducted at a temperature of no less than 100° C. For example, the formation of the gate insulating film is conducted, while the heating of the substrate is being prohibited. For example, the formation of the gate insulating film is conducted, while the substrate is being cooled to a temperature of no higher than room temperature. For example, the gate insulating film is formed by a plasma CVD method. For example, the gate insulating film is formed by a microwave plasma CVD method.

In another aspect thereof, the present invention provides a method for the fabrication of a field-effect transistor comprising the steps of forming a semiconductor layer serving as an active layer on a substrate, setting the substrate temperature at no higher than 100° C. and forming a first-stage gate insulating film on the semiconductor layer, and setting the substrate temperature at no less than 100° C. and forming a second-stage gate insulating film.

The first-stage gate insulating film and second-stage gate insulating film are formed by film forming processes conducted under different conditions or by different methods. For example, when gate insulating films are formed by a method in which temperature or discharge power are changed during film formation, the first-stage gate insulating film can be the film obtained prior to changes and the second-stage gate insulating film can be the film obtained after the changes.

For example, the above-described method additionally comprises a step of heat treating the first-stage gate insulating film in an atmosphere composed of water after the formation of the first-stage gate insulating film. For example, heat treatment of the gate insulating film is conducted at a temperature of no less than 100° C. For example, the formation of the first-stage gate insulating film is conducted, while the heating of the substrate is being prohibited. For example, the formation of the first-stage gate insulating film is conducted, while the substrate is being cooled to a temperature of no higher than room temperature. For example, the formation of the first-stage gate insulating film is conducted by a plasma CVD method. For example, the formation of the first-stage gate insulating film is conducted by a microwave method. For example, the formation of the second-stage gate insulating film is conducted by a plasma CVD method using TEOS gas.

DESCRIPTION OF THE PREFERRED EMBODIMENTS

Figure 1:
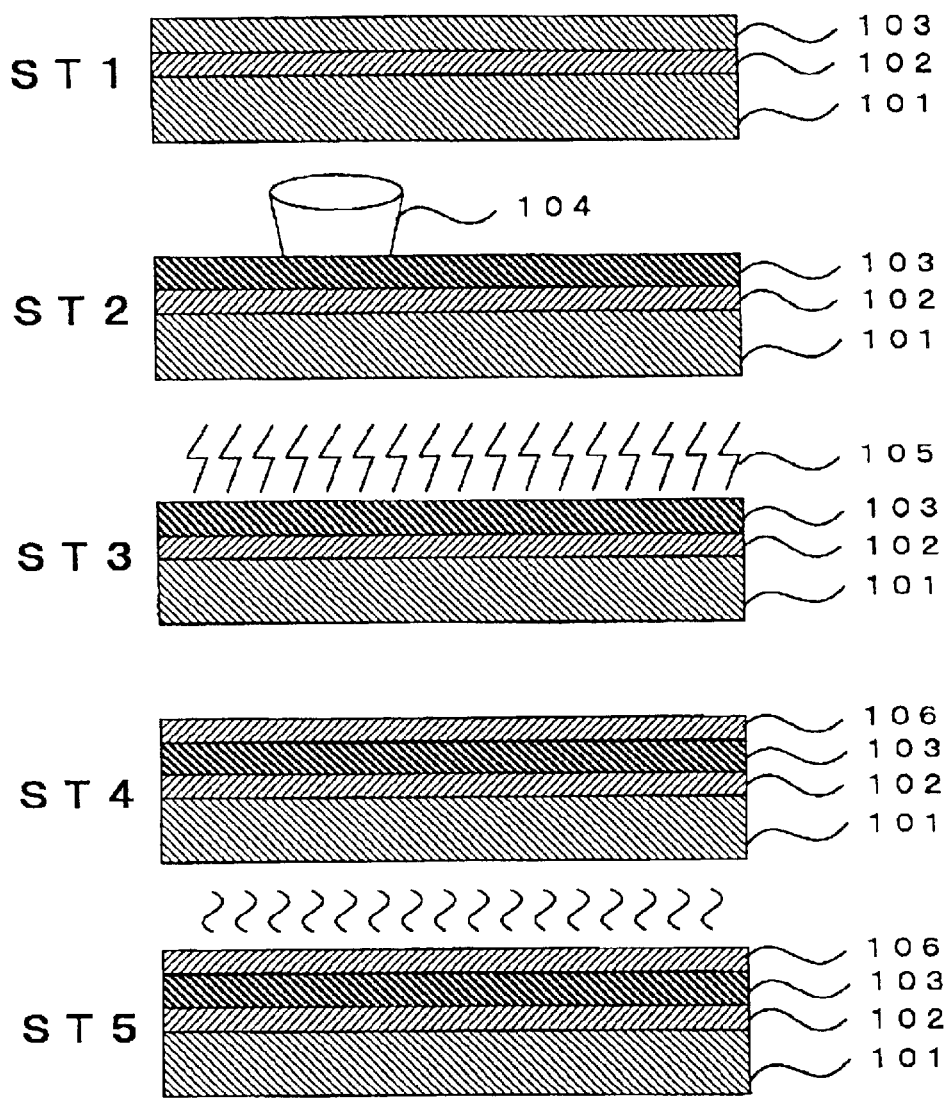
FIG. 1 is a process cross-sectional view (first) illustrating the method for the manufacture of a field-effect transistor in accordance with the present invention.
Figure 2:
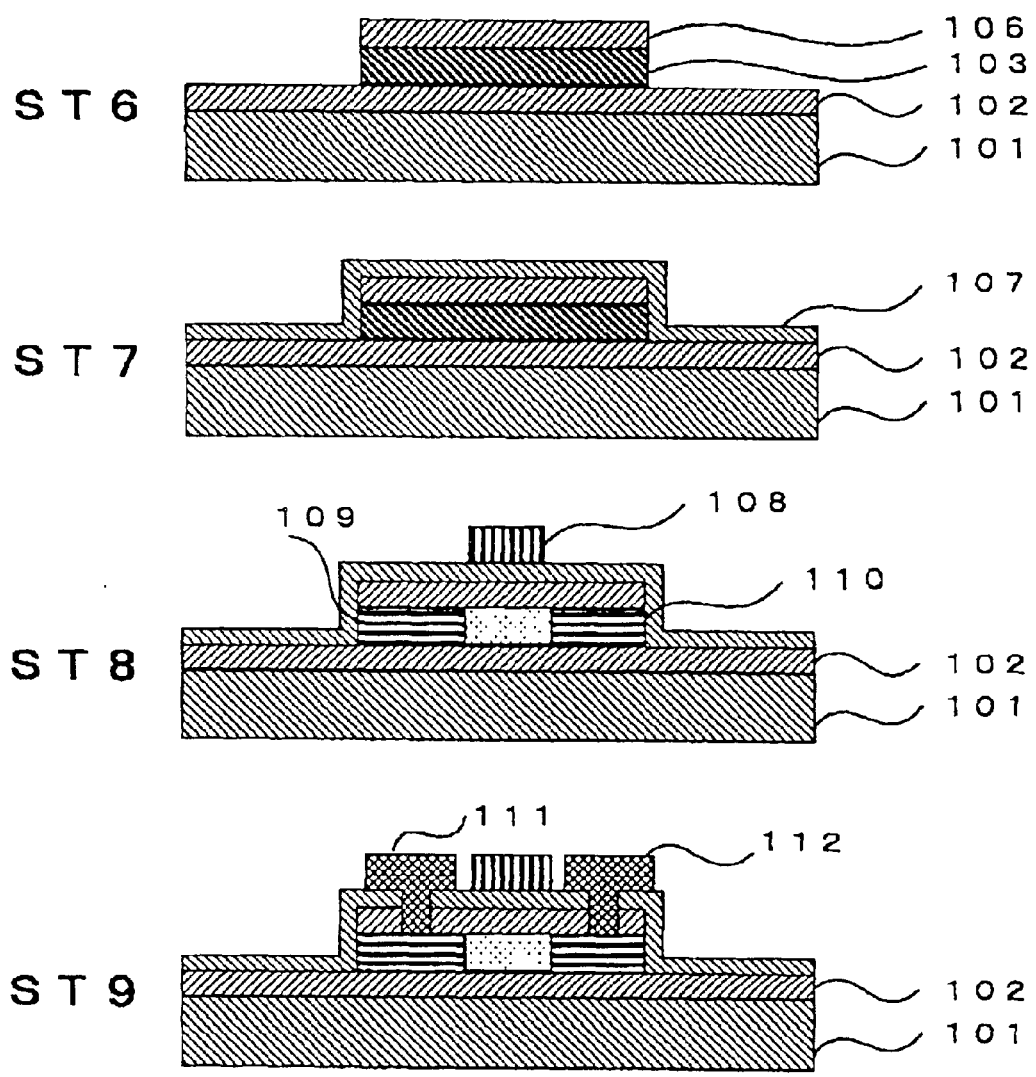
FIG. 2 is a process cross-sectional view (second) illustrating the method for the manufacture of a field-effect transistor in accordance with the present invention.

A preferred embodiment of the present invention will be described below with reference to the drawings attached. FIG. 1 and FIG. 2 are cross-sectional views illustrating the process for the fabrication of a polycrystalline silicon TFT. Formation of Semiconductor Thin Film (FIG. 1: ST1)

In order to implement the present invention, usually a prime protective layer 102 is formed on a substrate 101 and then a semiconductor layer 103 is formed thereon. Accordingly, the formation method consisting of such operations will be described.

Examples of substrates 101 suitable in accordance with the present invention include: conductive materials such as metals; ceramic materials such as silicon carbide (SiC), alumina ($Al_2O_3$), aluminum nitride (AlN) and the like; transparent or opaque insulating substances such as fused quartz or glass; semiconductors such as silicon wafers and the like; and LSI substrates obtained by processing the above-mentioned materials. The semiconductor layer 103 is deposited directly on the substrate or via a prime protective layer 102 or lower electrode (not shown in the figure). Furthermore, a single-crystal substrate such a silicon wafer can be directly used as semiconductor layer 103 serving as an active layer.

An insulating substrate such as silicon oxide film ($SiO_x$: $0<x\leq2$) or silicon nitride film ($Si_3N_x$: $0<x\leq4$) can be used as prime protective layer 102. When a thin-film semiconductor device such as TFT is fabricated on a usual glass substrate, it is important to control the penetration of impurities into the semiconductor layer. In such case, a semiconductor layer is preferably deposited after the formation of the prime protective layer so as to prevent the penetration of movable ions, for example, of sodium (Na) contained in the glass substrate into the semiconductor layer. The same extends to cases when various ceramic materials are used for the substrate. The prime protective layer prevents the diffusion and penetration of impurities, for example, from sintering aid raw materials contained in the ceramic, into the semiconductor portion. When it is necessary that a conductive material such as a metal material be used as a substrate and a semiconductor layer be electrically insulated form the metal substrate, the presence of the prime protective layer becomes mandatory for guaranteeing good insulating properties. Furthermore, when a semiconductor film is formed on a semiconductor substrate or an LSI element, the interlayer insulating film present between the transistors or wirings can simultaneously serve as the prime protective layer.

The prime protective method can be formed on a substrate by cleaning the substrate with pure water or an organic solvent such as alcohol and then employing a sputtering method or a CVD method such as atmosphere pressure chemical vapor deposition method (APCVD method), lower-pressure chemical vapor deposition method (LPCVD), or plasma chemical vapor deposition method (PECVD). When a silicon oxide film is used as the prime protective layer, the deposition can be conducted by the atmosphere pressure chemical vapor deposition method by using monosilane ($SiH_4$) and oxygen as starting materials at a substrate temperature, for example, from about 250° C. to about 450° C. In case of plasma chemical vapor deposition or sputtering, the substrate temperature is, for example, within a range from room temperature to about 400° C. The thickness of the prime protective layer should be sufficient to prevent the diffusion and penetration of impurity elements from the substrate. For example, it should be at least no less than about 100 nm. Taking into account the spread between the lots or substrates, the thickness of the prime protective layer is preferably no less than about 200 nm. If it is about 300 nm, the protective layer functions can be fully demonstrated. When the prime protective layer also serves as an interlayer insulating film between IC elements or wirings connecting them, the thickness is usually within a range from 400 nm to 600 nm. If the thickness of the insulating film is too large, cracks appear which are caused by stresses in the insulating film. For this reason, the maximum thickness is preferably about 2 $\mu$m. When productivity is an important issue the upper limit of insulating film thickness is at about 1 $\mu$m.

Semiconductor layer 103 will be further described. Examples of semiconductor layers suitable in accordance with the present invention, in addition to semiconductor films consisting of a single Group IV element such as silicon (Si) or germanium (Ge), include semiconductor films composed of several Group IV elements such as silicon-germanium ($Si_xGe_{1-x}$: 0<x<1), silicon carbide ($Si_xC_{1-x}$: 0<x<1), germanium carbide ($Ge_xC_{1-x}$: 0<x<1) and the like, complex compound semiconductor films composed of a Group III element and a Group V element such as gallium arsenide (GaAs), indium antimonide (InSb), and the like, complex compound semiconductor films composed of a Group II element and a Group VI element such as cadmium selenide (CdSe) and the like Furthermore, the present invention is also applicable to complex compound semiconductor films such as silicon-germanium-gallium-arsenic ($Si_xGe_yGa_zAs_z$: x+y+z=1), N-type semiconductor films obtained by doping those semiconductor films with a donor element such as phosphorus (P), arsenic (As), antimony (Sb), and the like, and P-type semiconductor films obtained by doping those semiconductor films with an acceptor element such as boron (B), aluminum (Al), gallium (Ga), indium (In), and the like. Those semiconductor films are formed by a CVD method such as APCVD method, LPCVD method, PECVD method, and the like, or by a PVD method such as sputtering method or vapor deposition method. When a silicon film is used as the semiconductor film, the deposition with the LPCVD method is conducted by using disilane ($Si_2H_6$) as a starting material and maintaining the substrate temperature within a range from about 400° C. to about 700° C. With the PECVD method, the deposition can be conducted by using monosilane ($SiH_4$) as a starting material and maintaining the substrate temperature within a range from about 100° C. to about 500° C. In the initial (as-deposited) state of the semiconductor film thus deposited, it has an amorphous, primary crystalline, finely crystalline, or polycrystalline structure. In accordance with the present invention, any of such initial states is allowed.

Furthermore, in the present specification, the term crystallization covers not only the crystallization of amorphous phase but also recrystallization of polycrystalline or finely crystalline phase. When the semiconductor film is used for a TFT, the appropriate thickness thereof is within a range from about 20 nm to about 100 nm.

Laser Crystallization of Semiconductor Film (FIG. 1: ST2, FIG. 3, FIG. 4)

After the prime protective layer and semiconductor layer have been formed on substrate 101, the semiconductor layer is crystallized by laser radiation (laser beam 104). The surface of silicon film deposited by a CVD method such as LPCVD method, PECVD method, and the like is often coated with a natural oxidation film. Therefore, this natural oxidation film has to be removed prior to irradiation with laser beam. For this purpose, for example, a wet etching method is employed in which the film is immersed in a hydrofluoric acid solution, or dry etching is conducted in plasma comprising fluorine.

Then, the substrate 101 having the semiconductor layer 103 formed thereon is set in a laser irradiation chamber. A part of the laser irradiation chamber is composed of a quartz window and laser beam 104 is irradiated through the quartz window after the chamber has been evacuated.

The laser beam will be described below. Laser beam 104 is preferably intensely absorbed by the surface of semiconductor layer 103 and practically not absorbed by prime protective layer 102 or substrate 101 located directly thereunder. Therefore, excimer layer, argon ion laser, or YAG laser higher harmonics with a wavelength within ultraviolet range or close thereto are preferred as the laser beam. Furthermore, high-power and ultra-short pulse generation is required to heat the semiconductor thin film to a high temperature and at the same time to prevent damage of substrate. Therefore, excimer lasers such as xenon chloride (XeCl) laser (wavelength 308 nm) or krypton fluoride (KrF) laser (wavelength 248 nm) are most suitable for laser beam generation.

Figure 3:
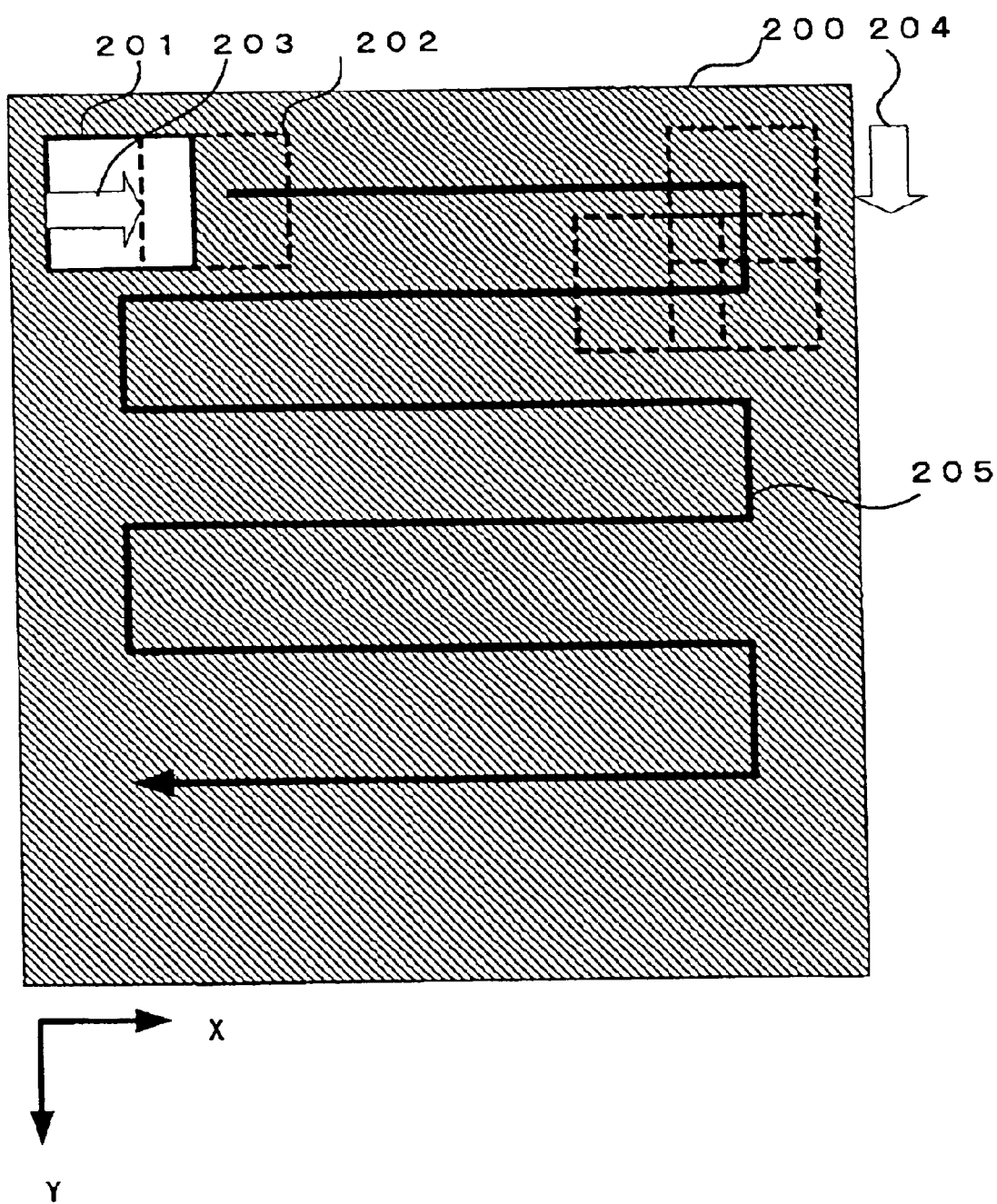
FIG. 3 illustrates a method for laser beam irradiation during laser crystallization.

The laser beam irradiation method will be described below with reference to FIG. 3. FIG. 3 is a plan view of substrate 200 which is the object of laser beam irradiation. The intensity half-width of the laser pulse is, for example, an ultra-short time from about 10 ns to about 500 ns. When the temperature of substrate 200 is within a range from about room temperature (for example, 25° C.) to about 400° C., laser irradiation is conducted in vacuum with a background vacuum degree of from about $10^{-4}$ Torr to about $10^{-9}$ Torr. The shape of the surface subjected to a single laser irradiation is a square or a rectangle with a diagonal of from about 5 mm to about 60 mm.

The explanation will be conducted hereinbelow with respect to a case using a beam that can crystallize, for example, a 8-mm square area in a single laser irradiation operation. After irradiating one site with a single-pulse laser irradiation in a position 201, the laser beam is shifted at a certain distance 203 in the horizontal direction (X direction) relative to substrate 200. In this position 202, another single-pulse laser irradiation is conducted. Continuous repetition of such shot-and-scan operations is suitable even for a substrate with a large surface area. The movement distance is from about 1% to about 99% of the irradiated region per each irradiation operation (for example, 50% correspond to 4 mm in the above-described example). Upon completing scanning in the horizontal direction (X direction), the beam is shifted at an appropriate distance 204 in the vertical direction (Y direction) and again scanning is conducted in the horizontal direction (-X direction) with a preset shift amount 203. Then, scanning is repeated to cover the entire substrate surface and complete the first-cycle laser irradiation. The energy density of the first-cycle laser irradiation is preferably within a range from about 50 mJ/cm$^2$ to about 600 mJ/cm$^2$. Once the first-cycle laser irradiation has been completed, a second-cycle laser irradiation is conducted, if necessary, over the entire substrate. When the second-cycle laser irradiation is conducted, the energy density thereof is preferably higher than that of the first-cycle laser irradiation and may be within a range from about 100 mJ/cm$^2$ to 1000 mJ/cm$^2$. Similarly to the first-cycle laser irradiation, scanning is conducted by shifting a rectangular irradiation region at an appropriate distance in the Y direction and X direction. Furthermore, if necessary, a third-cycle or fourth-cycle laser irradiation can also be conducted at a higher energy density. When such multistage laser irradiation method is used, a spread originating at the edges of the laser irradiation region can be completely eliminated. In each of one-stage irradiation cycles, laser irradiation is conducted at an energy density causing no damage to semiconductor film.

Figure 4:
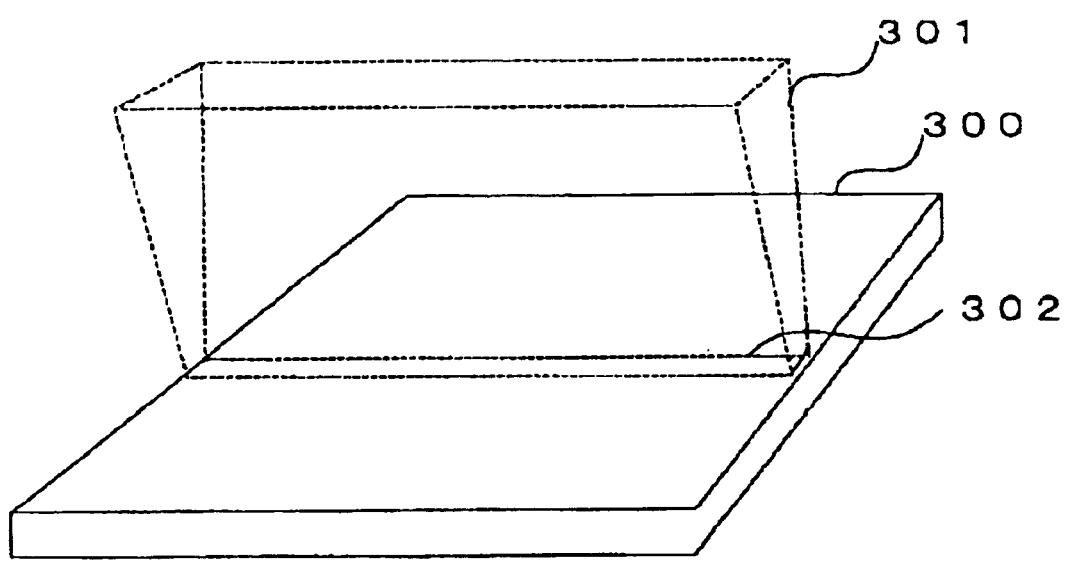
FIG. 4 illustrates a method for laser beam irradiation during laser crystallization.

In addition to scanning illustrated by FIG. 3, crystallization may also be promoted, for example, as shown in FIG. 4, by providing a line-like shape 302 of the irradiation zone by laser 301 on substrate 300, this shape having a width of about 100 $\mu$m and a length of no less than several tens of centimeters and scanning the substrate with the line-like laser beam. In this case, overlapping of beams in the width direction per each irradiation cycle is, for example, from about 5% to about 95% of the beam width. When the beam width is 100 $\mu$m and overlapping per beam is 90%, the beam advances 10 $\mu$m per one irradiation cycle. Therefore, The same point on substrate 300 is subjected to ten laser irradiation cycles. Usually, at least about five laser irradiation cycles are desired to cause uniform crystallization of a semiconductor film over the entire substrate. Therefore, the overlapping of beams per each irradiation cycle is required to be of no less than 80%. In order to obtain reliably a polycrystalline film with a high degree of crystallinity, the overlapping is preferably adjusted to a range from about 90% to about 97% so that one point be irradiated from about 10 times to about 30 times. The merit of the process using a line beam is that crystallization within a wide area is conducted by unidirectional scanning and therefore, a throughput is increased.

Plasma Treatment of Semiconductor Thin Film (FIG. 1: ST3)

Defects with a high density of about $10^{18}$ cm$^{-3}$ are present in the polycrystalline silicon film immediately after laser crystallization. This is because laser crystallization is a very fast crystal growth process, and an especially large number of defects are localized at crystal grain boundaries. Those defects are originally in the form of dangling bonds of silicon. Usually, the dangling bonds are neutral, but they can be charged by trapping the carriers. If such defects are present at a high density in a polycrystalline silicon film, all of the carriers induced by field effect when a TFT is operated are entrapped by the defects. Therefore, no current flows between the source and drain electrodes. As a result, it is necessary to apply a higher gate voltage, which leads to the increase in threshold voltage. To prevent it, once the entire surface crystallization in the above-described laser crystallization process (see FIGS. 3, 4) has been completed, the substrate is transferred with a vacuum robot into a plasma treatment chamber. Hydrogen, oxygen, or nitrogen gas is introduced into the chamber via a mass flow controller and plasma discharge 105 is initiated over the entire surface of a sample with parallel flat RF electrodes. During this process, the gas pressure is adjusted to about 1 Torr, for example. Plasma can be also generated by inductively coupled RF discharge, ECR discharge, DC discharge, or ionization employing thermal electrodes produced by a hot filament. When a polycrystalline silicon film immediately after laser crystallization is subjected to hydrogen plasma treatment at a substrate temperature of 250° C. for 5 to 300 s, the density of defects in the film can be reduced dramatically to about $10^{16}$ cm$^{-2}$eV$^{-1}$ and a polycrystalline silicon film with excellent electric properties can be obtained.

Since hydrogen has a very high diffusion rate in silicon films, if polycrystalline silicon with a film thickness, for example, of about 50 nm is processed, the sufficient processing time is about 160 s. Hydrogen has a small atomic radius and effective defect passivation to deep positions in the polycrystalline silicon film, that is, to the interface with the prime layer can be conducted within a short time. Depending on the substrate temperature, hydrogen plasma produces the effect of a silicon etching mode. In order to avoid it, the substrate temperature has to be maintained at a temperature of about 100–400° C. Furthermore, the tact time of the process can be effectively shortened, for example, by conducting laser crystallization and then moving the substrate into a separate vacuum chamber with a vacuum robot arm and then conducting he above-described hydrogen, oxygen, and nitrogen plasma treatment.

For the reasons described above, hydrogen plasma is employed for reducing the number of defects. However, the number of defects can also be reduced by conducting plasma treatment by oxygen plasma, nitrogen plasma, fluorine plasma, and the like.

Formation of First-stage Insulating Film Formation (FIG. 1: ST4)

The above-described processes can improve quality of polycrystalline silicon films. Another important process is the formation of a high-quality MOS interface. In this process, oxygen atoms are smartly bonded to silicon atoms present on the polycrystalline silicon surface and the interface level density is reduced.

Since about $10^{15}$ cm$^{-2}$ bonds are present on the silicon film surface, it is important that practically all of them form purely chemical bonds with $SiO_2$. In order to improve transistor characteristics of TFT, it is necessary to limit the interface level density, for example, to about $10^{10}$ cm$^{-2}$. Thus, only about one defect is allowed for 10,000 silicon bonds and the following bonds have to be orderly bonded to oxygen atoms. In the conventional plasma CVD process, the interface level density could be controlled only to $10^{12}$ cm$^{-2}$eV$^{-1}$.

In accordance with the present invention, in the process for forming a gate insulating film on a semiconductor layer, the treatment is conducted at a substrate temperature of no higher than 100° C. In plasma CVD, $SiH_4$ gas is decomposed by active oxygen radicals present in plasma and $SiO_2$ is formed in a gas phase and deposited on the substrate. $SiO_2$ deposited in such highly reactive atmosphere can form chemical bonds with silicon on the semiconductor surface and produce a good interface. However, because of active species of oxygen present in the film-forming atmosphere, oxidation of semiconductor surface proceeds simultaneously with the deposition of $SiO_2$. Oxidation as referred herein is an effect proceeding at a level of no more than one atom level. If silicon is oxidized, volume is increased by a factor of 1.5 and local stress generation accompanies the formation of oxidized Si—$SiO_2$ bonds. This is the main reason for the appearance of interface level. Thus, if the ratio of Si—$SiO_2$ bonds formed by oxidation increases with respect to the ratio at which good Si—SiO$_2$ bonds are formed by deposition of SiO$_2$, eventually a MOS interface having a high interface level is formed. Quantitatively speaking, almost all of about 10$^{15}$ cm$^{-2}$ silicon bonds present on the interface form good bonds by SiO$_2$ deposition. However, if Si—SiO$_2$ bonds whose number is no less than 10$^{10}$ cm$^{-2}$ among the above-mentioned bonds are formed by silicon oxidation, all of them become interface levels. Thus, even if oxidation occurs per one Si—SiO$_2$ bond in 100,000 bonds, that is, with a probability of 1 of 10$^5$, interface levels are produced in an amount which cannot be ignored. Such interface formation mechanism obviously occurs at the initial stage of film formation. Thus, the above-described oxidation process is initiated when SiO$_2$ deposition on semiconductor is started. The present invention discloses this interface formation mechanism and also discloses that the activation energy of the density of interface levels formed by the above-described oxidation is very high. In other words, the density of interface levels can be controlled by substrate temperature.

Figure 5:
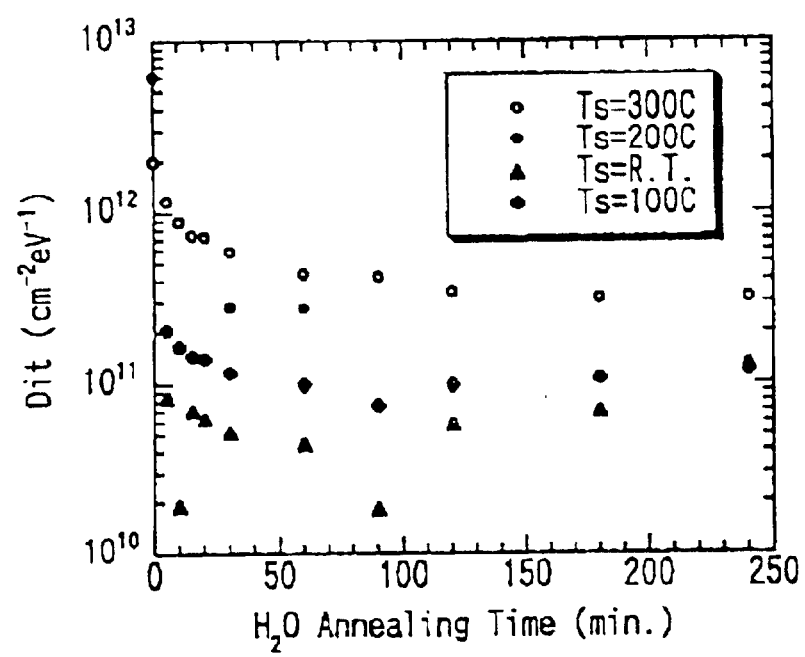
FIG. 5 illustrates the relationship between the interface level density of MOS interface formed in accordance with the present invention and the substrate temperature.

FIG. 5 presents experimental results on the substrate temperature Ts during insulating film formation and relationship between the density of interface levels (Dit) [cm$^{-2}$eV$^{-1}$] and the time of thermal annealing in hydrogen atmosphere. Those results indicate that thermal annealing in a hydrogen atmosphere can reduce the respective number of interface levels, but this treatment fails to restore the bonds that has been oxidized. However, the probability of oxidation occurring on silicon surface can be dramatically reduced by decreasing the substrate temperature during film formation.

It indicates that oxidation occurring at the interface strongly depends on the substrate temperature, that is, the oxidation occurs easier with the increase in substrate temperature. FIG. 5 demonstrates that the density of interface levels can be reduced to about 1×10$^{11}$ cm$^{-2}$eV$^{-1}$ by decreasing the substrate temperature to less than 100° C. (for example, to room temperature, R.T.). Furthermore, if the substrate temperature is made about 100° C., the appearance of OH bonds, which are byproducts of plasma CVD, in the insulating film can be inhibited. As a result, reliability of insulating film and flat-band voltage shift can be guaranteed, thereby providing conditions favorable for practical applications.

Furthermore, film growing may also be conducted without substrate heating. With such method, the apparatus structure is simplified which is very beneficial in terms of production cost. Moreover, since the adjustment of substrate temperature is not required, the process throughput is high. Moreover, with such method, a good interface level density of 8×10$^{10}$ cm$^{-2}$eV$^{-1}$ is provided. When film if formed by plasma CVD, heat is transferred from plasma to substrate and the substrate temperature rises. Therefore, an effective approach also comprises closely controlling the substrate to a low temperature. Thus, an even better interface level density can be obtained by cooling the substrate to a temperature about or below the room temperature. As shown in FIG. 5, the interface level density of 3×10$^{10}$ cm$^{-2}$eV$^{-1}$ can be decreased to 1×10$^{10}$ cm$^{-2}$eV$^{-1}$ by cooling the substrate to a temperature of −50° C. Those values of interface level density are the same as the values of interface level density obtained when an insulating film was formed by thermal oxidation. Thus, the decrease of substrate temperature during insulating film formation makes it possible to form an excellent MOS interface even at a low temperature. The utilization of such ultrahigh-quality MOS interface allows the threshold voltage of field-effect transistor to be decreased to about 1 V. As a result, a circuit with an ultralow power consumption can be realized.

The above-described interface control technology is especially important in forming an insulating film by plasma. This is because a large number of oxygen active species are produced under a lower pressure. Thus, the control of oxidation process occurring with a slight probability on a semiconductor surface with those oxygen active species is essential for the formation of MOS interface using plasma.

Moreover, in plasma CVD using microwave discharge, the effect of interface level density reduction is significant. This is because the microwave discharge plasma has an advantage of a high plasma density, but since it is generated under a relatively low pressure of about 10$^{-3}$ Torr, the mean free path of electrons in the plasma is long and a higher-order dissociation is promoted. Thus, atomic oxygen and oxygen radicals, rather than oxygen molecule radicals, mainly participate in the reaction and they are very active with respect to interface oxidation. Therefore, in the formation of an insulating film by using microwave discharge plasma, the interface level density can be dramatically decreased by decreasing the substrate temperature.

A specific process, for example, comprises conducting continuous plasma treatment in vacuum of a polycrystalline silicon film formed by laser crystallization and then vacuum transporting it into an insulating film formation chamber, without disrupting the vacuum state. The substrate temperature is adjusted to less than 100° C. inside the vacuum chamber and evacuation is conducted till the background vacuum degree reaches 10$^{-6}$ Torr. In such state, oxygen gas and silane gas (SiH$_4$) are fed into the vacuum chamber. A method of diluting with He gas for discharge stabilization may also be employed. Typically, the oxygen flow rate is no less than five times that of silane gas. In this state, plasma discharge is initiated and a SiO$_2$ film (insulating film) 106 is formed. Examples of the discharge mode include flat and parallel RF discharge, ICP discharge, ECR discharge and the like. An RF power source, VHF, UHF power source, and microwave source can be used as a power source. The above-described process is a first-stage insulating film formation process.

Annealing Process (FIG. 1: ST5)

In accordance with the present invention, upon completion of the insulating film formation process ST4, the substrate is removed from the vacuum apparatus and heat treated in an atmosphere comprising water at a substrate temperature of 100° C. or more. The insulating film 106 formed at a low substrate temperature in the above-described process ST4 contains a large number of Si—OH bonds which are the reaction byproducts and have a poor bulk insulating characteristic. Accordingly, this process is conducted to improve this characteristics. In particular, defects located in the insulating film present in the vicinity of semiconductor surface and MOS interface allowing for entrapment of carriers also affect the MOS interface levels.

Figure 6:
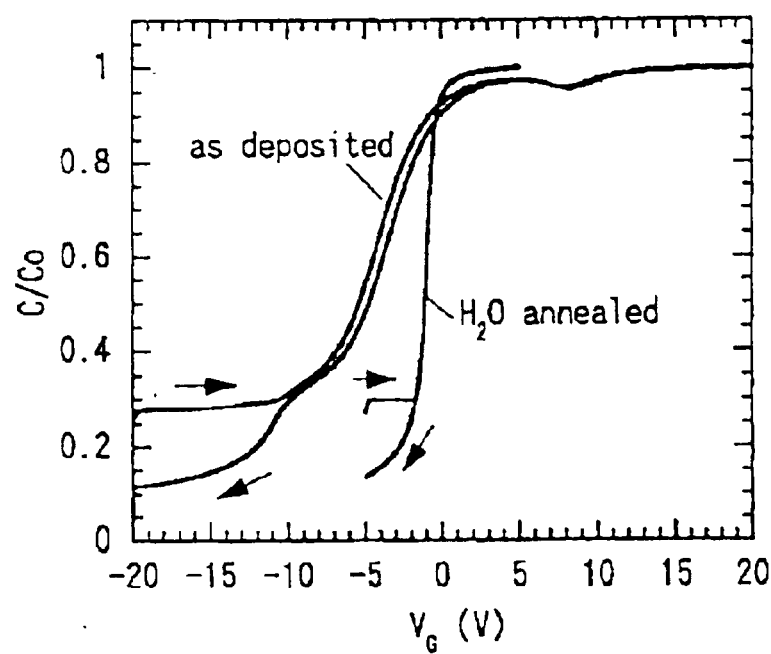
FIG. 6 is a diagram illustrating the high-frequency C-V characteristic of MOS structure fabricated by the process for forming a MOS interface in accordance with the present invention.

FIG. 6 shows a CV characteristic directly after the insulating film formation and after the above-described annealing process has been conducted. If a large number of OH bonds are present in the vicinity of insulating film interface, they produce an adverse effect on interface characteristics. Furthermore, the breakdown voltage of the bulk insulating film is decreased. However, if heat treatment is conducted in a steam atmosphere at a temperature of no less than 100° C., the number of those Si—OH bonds can be reduced dramatically. FIG. 6 clearly shows the significance of this effect. As a result, the present invention can guarantee a dramatic reduction in interface level density, a high breakdown voltage, and good reliability.

Element Separation Process (FIG. 2: ST6)

A MOS structure of extremely high quality is formed by the above-described continuous vacuum process comprising laser crystallization, plasma treatment, and MOS interface formation. Then, element separation is conducted in order to insulate electrically the TFT elements from each other.

For this purpose, as shown in FIG. 2 (ST6), the insulating film 106 and polycrystalline silicon layer 103 are etched continuously. For example, a pattern is formed on the insulating film 106 by photolithography and then $SiO_2$, which is the insulating film 106, is etched by wet or dry etching. The polycrystalline silicon layer 103 is dry etched thereafter. Since in this process two layers, $SiO_2$ and poly-Si film, are etched, measures should be taken to avoid the formation of defects on edges after etching.

Second-stage Gate Insulating Film Formation (FIG. 2: ST7)

Once the island-like insulating film 106 and polycrystalline silicon layer 103 have been formed, a gate insulating film 107 is formed over the entire substrate surface. Examples of methods suitable for the formation of gate insulating film include ECR plasma CVD method, flat and parallel RF discharge plasma CVD method, and the like. Furthermore, the insulating film may also be formed by SiO deposition among the oxygen radicals for the second time. However, if the insulating film formed in the second stage does not have good step coverage, an electric short circuit can occur in the step portions, causing decrease in breakdown voltage. For this reason, film forming method providing for excellent step coverage, for example, plasma CVD using TEOS and oxygen as starting material gases is effective.

Furthermore, since the insulating film formed in the first stage is formed at a low temperature, the breakdown voltage tends to decrease. However, with the two-stage insulating film formation method disclosed by the present invention, the breakdown voltage of the entire insulating film can be increased by forming the insulating film at a substrate temperature of no less than 100° C. as a second stage process.

Figure 7:
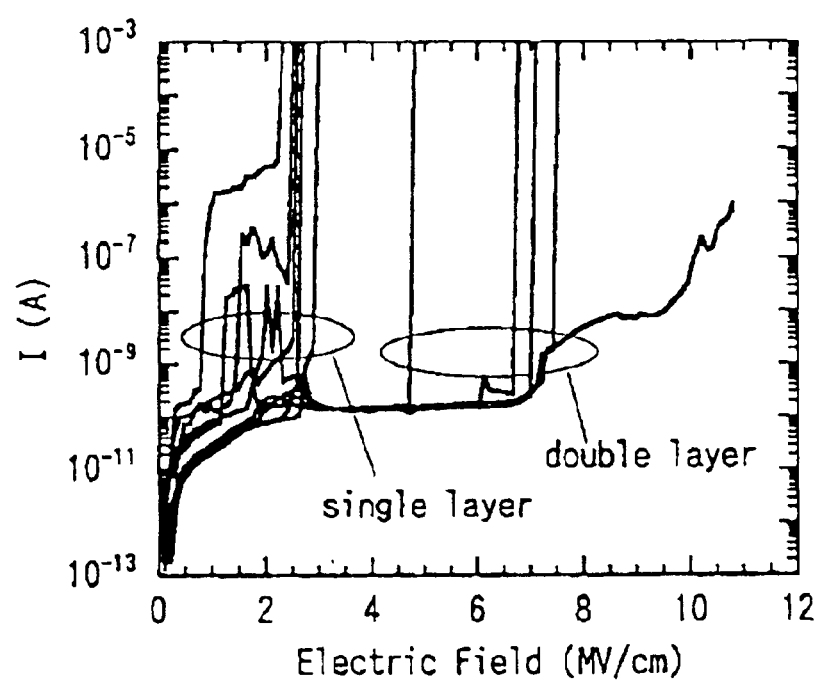
FIG. 7 is a diagram illustrating the breakdown voltage characteristic of a MOS structure fabricated by the two-stage insulating film formation process in accordance with the present invention and a MOS structure formed of a single layer.

FIG. 7 compares the results obtained in studying the breakdown voltage of an insulating film (single layer) when only the first-stage film was formed (substrate temperature 100° C.) and those obtained in studying an insulating film with a two-layer structure (double layer) after the formation of a second-stage insulating film (substrate temperature 300° C., TEOS+$O_2$). Those results clearly show that the second-stage insulating film formation method disclosed by the present invention makes it possible to improve the breakdown voltage of the insulating film to a level of about 7 MV/cm sufficient for practical applications. Thus, using different insulating film forming methods for MOS interface formation and bulk insulating film formation makes it possible to realize both the excellent MOS interface characteristics and the bulk insulating film characteristics, which was impossible with the conventional low-temperature process.

Subsequent Processes

Then, as shown in FIG. 2 (ST8), a thin film serving as a gate electrode 108 is deposited by a PVD method or CVD method. The material of gate electrode preferably has a low electric resistance and good stability against thermal processing at a temperature of about 350° C.; for example, metals with a high melting point, such as tantalum, tungsten, chromium, and the like are suitable for this purpose. Furthermore, the thickness of the gate electrode should be about 700 nm in order to prevent hydrogen channeling when a source and a drain are formed by ion doping. Among those metals with a high melting point, for example, tantalum is appropriate as a material demonstrating no cracking induced by stresses even when the film is grown to a thickness of 700 nm.

Patterning is conducted after the deposition of thin film serving as a gate electrode and then source and drain regions 109, 110 are formed by conducting ion implantation of dopants into the semiconductor film. In this process, the gate electrode serves as a mask for ion implantation. Therefore, a self-aligned structure is obtained in which a channel is formed only below the gate electrode. Two types of methods are suitable for ion implantation: anion doping method in which hydrogen and a hydride of the dopant element are implanted with a mass-inseparable ion implantation apparatus and an ion bombardment method in which only the desired dopant element is implanted by using a mass-separable ion implantation apparatus. Hydrides of the dopant elements such as phosphine ($PH_3$) or diborane ($B_2H_6$) diluted with hydrogen to a concentration from about 0.1% to about 10% are used as the starting materials for ion doping. With the ion bombardment method, hydrogen ions (protons or hydrogen molecule ions) are implanted after the desired dopant elements have been implanted. As described above, in order to maintain stability of MOS interface or gate insulating film, the substrate temperature is preferably no more than 350° C. in ion doping method, ion bombardment method, or ion implantation method. On the other hand, in order to conduct with high stability the activation of implanted dopants at a low temperature of no higher than 350° C. (in the present specification, this process is referred to as low-temperature activation), the substrate temperature during ion implantation is preferably no less than 200° C. Furthermore, the substrate temperature during ion implantation should be no less than 250° C. in order to activate reliably at a low temperature the dopant ions that have been implanted to a low concentration so as to produce an LDD structure or to conduct channel doping to adjust the threshold voltage of transistor. Thus, if ion implantation is conducted in a state with a high substrate temperature, recrystallization simultaneously proceeds during crystal fracture accompanying ion implantation into a semiconductor film. As a result, amorphization of the ion implantation region can be prevented. Thus, the region where ion implantation has been conducted remains crystalline even after ion implantation and subsequent activation of implanted ions can be conducted even at a low activation temperature of no more than about 350° C. When CMOS TFT is fabricated, NMOS and PMOS are alternately covered with a mask made from an appropriate mask material, such as polyimide resin, for respective ion implantation by the above-described method.

Laser activation by irradiation, for example, with an excimer laser is an effective method for dopant activation. With such method the doped polycrystalline silicon of the source and drain regions is melted and solidified and dopants are activated by laser irradiation via the insulating film.

Then, as shown by ST9 in FIG. 2, the fabrication of a thin-film transistor is completed by opening a contact hole above the source and drain and forming source and drain lead-out electrodes 111, 112 and wirings, for example, by PVD or CVD method.

A field-effect transistor was fabricated by the manufacturing method of the embodiment of the present invention. Substrate 101 and prime protective layer 102 were according to the above explanation. In one example, an alkali-free glass for general applications having a rectangular shape of 300 mm×300 mm was used as substrate 101.

First, a prime protective layer 102 which is an insulating substance was formed on substrate 101. Here, a silicon oxide film having a thickness of about 200 nm was deposited by ECR-PECVD method at a substrate temperature of 150° C.

Then, a semiconductor layer 103 such as pure silicon film serving as an active layer of a thin-film transistor was deposited. The thickness of the semiconductor film was about 50 nm. In this embodiment, an amorphous silicon film 103 was deposited at a deposition temperature of 425° C. by using high-vacuum LPCVD apparatus and feeding disilane ($Si_2H_6$) as a starting material gas at 200 SCCM. First, a plurality of substrates (for example, 17 substrates) were disposed, so that the surface side thereof was facing downward, inside a reaction chamber of a high-vacuum LPCVD with a reaction chamber temperature of 250° C. Then, a turbomolecular pump was started. Once the rotation rate of the turbomolecular pump has reached the rated level, the temperature inside the reaction chamber was raised from 250° C. to a deposition temperature of 425° C. within about 1 h. In the initial 10 min since the beginning of temperature increase, absolutely no gas was introduced into the reaction chamber and the temperature was raised in vacuum. Then, heating was continued while nitrogen gas with a purity of no less than 99.9999% was fed at 300 SCCM. The average pressure inside the reaction chamber in this process was $3.0 \times 10^{-2}$ Torr. Once the deposition temperature has been reached, disilane ($Si_2H_6$) which was a starting material was fed at 200 SCCM and at the same time helium (He) with a purity of no less than 99.9999 was fed at 1000 SCCM for dilution. The pressure inside the reaction chamber immediately after the beginning of deposition was about 0.85 Torr. In the course of deposition, the pressure inside the reaction chamber gradually increased and just before completion of deposition it was about 1.25 Torr. In silicon film 103 deposited in a similar manner, the variation of thickness was within ±5% within a 286-mm square region, excluding about 7 mm on the periphery of substrate.

Then, prior to laser crystallization, the amorphous silicon film was immersed in a hydrofluoric acid solution and the natural oxidation film present on the semiconductor layer 103 was etched out. Typically the exposed surface of a silicon film is extremely unstable and easily reacts with an atmosphere where the silicon thin film is maintained. Therefore, as a pretreatment conducted prior to laser irradiation, it is necessary not only to remove the natural oxidation film, but also to stabilize the exposed silicon film surface. For this purpose, treatment with a hydrofluoric acid solution is preferably conducted. In the present embodiment, the mixing ratio of hydrofluoric acid and pure water was 1:30. Upon immersion for about 20 to 30 semiconductor into such hydrofluoric acid solution, washing with pure waster was immediately conducted for 10–20 min. Pure water was thereafter removed with a spinner. As a result, the silicon film had a stabilized surface terminated with hydrogen atoms.

Laser beam irradiation was then conducted. In the present embodiment, irradiation was conducted with an excimer laser (wavelength:308 nm) of xenon chloride (XeCl). The intensity half-width of laser pulse (half-width with respect to time) was 25 ns. The substrate was set in a laser crystallization chamber, followed by evacuation. Upon evacuation, the substrate temperature was raised to 250° C. A single laser irradiated area was a square with 10 mm on a side. The energy density in the irradiation area was 160 mJ/cm$^2$. The irradiation was repeated (see FIG. 3), while shifting the laser beam so as to obtain a 90% overlapping (in other words, shifting by 1 mm per each irradiation cycle). As a result, amorphous silicon was crystallized on the entire substrate with 300 mm on a side. Second laser irradiation was conducted by using the same irradiation method. In the second laser irradiation, the energy density was 180 mJ/cm$^2$. The operations were repeated third and fourth time by raising the irradiation energy density by about 20 mJ/cm$^2$ each time, and finally laser irradiation was completed by conducting irradiation at an energy density of 440 mJ/cm$^2$. If irradiation is conducted at a high energy exceeding the irradiation laser energy of 450 mJ/cm$^2$, refining of p-Si grains is initiated. For this reason, irradiation with the energy above this level was avoided.

The substrate was then transported into a plasma treatment chambers, while being maintained under vacuum, and hydrogen gas was introduced into the chamber. In this example, hydrogen with a purity of 99.999% was introduced from a mass flow controller and the pressure inside the chamber was adjusted to 1 Torr. In this state, a discharge was conducted by applying 13.56 MHz RF to parallel flat electrodes, and defects present in laser crystallized poly-Si film were terminated by hydrogen. The substrate temperature was 250° C. and the input RF power was 3 W/cm$^2$. Since hydrogen can diffuse in the film within a rather short time, the defects present at a large depth in the polycrystalline silicon film and at the interface with the prime layer were effectively terminated by treatment conducted for 160 s.

Substrate 100 was then transported into an insulating film formation chamber, while being maintained under vacuum. Upon completion of substrate transportation, the chamber was evacuated to a degree of vacuum of 10$^{-6}$ Torr. The substrate was cooled herein to a temperature of −100° C.

Within this period, silane gas and oxygen gas were introduced into the chamber at a flow rate ratio of 1:6 and the pressure inside the chamber was adjusted to $2 \times 10^{-3}$ Torr. If the substrate temperature is stable, ECR discharge is induced and the formation of insulating film is initiated. The input microwave power was 1 kAW, and microwaves were introduced from an inlet window parallel to magnetic force lines.

An ECR point is in a position at a distance of 20 cm from the inlet window. The film growth was conducted at a rate of 100 nm/min. As a result, a first-layer gate insulating film 106 having a thickness of 30 nm was formed.

The substrate was then removed from the vacuum chamber and set into a saturated steam atmosphere at a temperature of 330° C., where heat treatment was conducted for 90 min. The polycrystalline silicon layer 103 and first-layer insulating film 106 were then continuously etched. A second-layer insulating film 107 was then deposited to a thickness of 70 nm at a substrate temperature of 350° C. by a flat and parallel RF discharge PECVD method. A gaseous mixture of TEOS (Si—(O—CH$_2$—CH$_3$)$_4$) and oxygen (O$_2$) was used as a starting gas. A thin film serving as a gate electrode 108 was then deposited by a PVD method or CVD method. Usually, a gate electrode and gate wiring are fabricated from the same material in the same process. Therefore, the material thereof preferably has a low electric resistance and good stability with respect to heat treatment at a temperature of about 350° C. In the present embodiment, a tantalum thin film with a thickness of 600 nm was formed by sputtering. The substrate temperature during the tantalum thin film formation was 180° C. and argon gas containing 6.7% nitrogen was used as a sputtering gas. Similarly formed tantalum thin film had an α crystal structure and its specific resistance was about 40 μΩcm. Upon deposition of the thin film serving as a gate electrode, patterning was conducted and then dopant ion implantation into the semiconductor film was conducted to form source and drain regions 109, 110 and channel region. Since in this process the gate electrode 108 served as a mask for ion implantation, a self-aligned structure was obtained in which the channel was formed only below the gate electrode. Hydrides of the dopant elements such as phosphine ($PH_3$) or diborane ($B_2H_6$) diluted with hydrogen to a concentration from about 0.1% to about 10% were used as starting materials for ion doping. In the present embodiment, with an object of forming an NMOS structure, an ion doping apparatus was used and phosphine ($PH_3$) diluted with hydrogen to a concentration of 5% was implanted at an accelerating voltage of 100 keV. The total ion implantation ratio, including $PH_3^+$ and $H_2^+$ ions was $1\times10^{16}$ $cm^{-2}$.

The formation of a thin-film transistor was completed by opening a contact hole above the source and drain and forming source and drain lead-out electrodes 111, 112 and wiring by PVD or CVD method.

The conventional technology provided no effective method for forming high-quality MOS interfaces. However, using the method for the fabrication of a field-effect transistor in accordance with the present invention as described above makes it possible to form a MOS interface of a very high quality. As a result, a field-effect transistor with high mobility and low threshold voltage can be fabricated and a circuit with an ultralow power consumption can be realized.

The entire disclosures of Japanese Patent Application Nos. 2000-267286 filed Sep. 4, 2000 and 2001-263559 filed Aug. 31, 2001 are incorporated by reference herein.

What is claimed is:

1. A method for the fabrication of a field-effect transistor comprising the steps of:

forming a semiconductor layer serving as an active layer on a substrate;

setting the substrate temperature at no higher than 100° C. and forming a gate insulating film on said semiconductor layer, such that interface level density between the semiconductor layer and the gate insulating film is no greater than $10^{11}$ $cm^{-2}eV^{-1}$; and heat treating said gate insulating film in an atmosphere containing water.

2. The method for the fabrication of a field-effect transistor according to claim 1, wherein heat treatment of said gate insulating film is conducted at a temperature of no less than 100° C.

3. The method for the fabrication of a field-effect transistor according to claim 1, wherein the formation of said gate insulating film is conducted while heating of said substrate is being prohibited.

4. The method for the fabrication of a field-effect transistor according to claim 1, wherein the formation of said gate insulating film is conducted while said substrate is being cooled to a temperature of no higher than room temperature.

5. The method for the fabrication of a field-effect transistor according to claim 1, wherein said gate insulating film is formed by a plasma CVD method.

6. The method for the fabrication of a field-effect transistor according to claim 1, wherein said gate insulating film is formed by a microwave plasma CVD method.

7. A method for the fabrication of a field-effect transistor comprising the steps of:

forming a semiconductor layer serving as an active layer on a substrate;

setting the substrate temperature at no higher than 100° C. and forming a first-stage gate insulating film on said semiconductor layer, such that interface level density between the semiconductor layer and the gate insulating film is no greater than $10^{11}$ $cm^{-2}eV^{-1}$; and selling said substrate temperature at no less than 100° C. and forming a second-stage gate insulating film.

8. The method for the fabrication of a field-effect transistor according to claim 7, further comprising a step of heat treating said first-stage gate insulating film in an atmosphere containing water after the formation of said first-stage gate insulating film.

9. The method for the fabrication of a field-effect transistor according to claim 8, wherein heat treating of said gate insulating film is conducted at a temperature of no less than 100° C.

10. The method for the fabrication of a field-effect transistor according to claim 7, wherein the formation of said first-stage gate insulating film is conducted while heating of said substrate is being prohibited.

11. The method for the fabrication of a field-effect transistor according to claim 7, wherein the formation of said first-stage gate insulating film is conducted while said substrate is being cooled to a temperature of no higher than room temperature.

12. The method for the fabrication of a field-effect transistor according to claim 7, wherein the formation of said first-stage gate insulating film is conducted by a plasma CVD method.

13. The method for the fabrication of a field-effect transistor according to claim 7, wherein the formation of said first-stage gate insulating film is conducted by a microwave plasma CVD method.

14. The method for the fabrication of a field-effect transistor according to claim 7, wherein the formation of said second-stage insulating film is conducted by a plasma CVD method using TEOS gas.

15. A method for the fabrication of an electronic apparatus comprising:

forming a semiconductor layer serving as an active layer on a substrate;

setting the substrate temperature at no higher than 100° C. and forming a gate insulating film on said semiconductor layer, such that interface level density between the semiconductor layer and the gate insulating film is no greater than $10^{11}$ $cm^{-2}eV^{-1}$, and heat treating said gate insulating film in an atmosphere containing water.

16. A method for the fabrication of an electronic apparatus comprising:

forming a semiconductor layer serving as an active layer on a substrate;

setting the substrate temperature at no higher than 100° C. and forming a first-stage gate insulating film on said semiconductor layer, such that interface level density between the semiconductor layer and the gate insulating film is no greater than $10^{11}$ $cm^{-2}eV^{-1}$; and setting said substrate temperature at no less than 100° C. and forming a second-stage gate insulating film.

* * * * *

UNITED STATES PATENT AND TRADEMARK OFFICE
CERTIFICATE OF CORRECTION

| | |
|---|---|
| PATENT NO. | : 6,905,920 B2 |
| APPLICATION NO. | : 09/945247 |
| DATED | : June 14, 2005 |
| INVENTOR(S) | : Seiichiro Higashi and Daisuke Abe |

It is certified that error appears in the above-identified patent and that said Letters Patent is hereby corrected as shown below:

Column 2,
Line 32, "interfaces" should be -- interface --.
Line 47, "rises" should be -- raises --.
Line 57, "dose" should be -- close --.

Column 4,
Line 59, "form" should be -- from --.

Column 7,
Line 31, "The" should be -- the --.

Column 8,
Line 25, "he" should be -- the --.

Column 9
Lines 23-24, "[cm$^-$2eV$^{-1}$]" should be -- [cm$^{-2}$eV$^{-1}$] --.
Line 28, "has" should be -- have --.

Column 10,
Line 51, "characteristics" should be -- characteristic --.

Column 13,
Line 27, after "99.9999" insert -- % --.
Line 49, "waster" should be -- water --.

Column 14,
Line 12, "chambers" should be -- chamber --.

UNITED STATES PATENT AND TRADEMARK OFFICE
CERTIFICATE OF CORRECTION

| | |
|---|---|
| PATENT NO. | : 6,905,920 B2 |
| APPLICATION NO. | : 09/945247 |
| DATED | : June 14, 2005 |
| INVENTOR(S) | : Seiichiro Higashi and Daisuke Abe |

It is certified that error appears in the above-identified patent and that said Letters Patent is hereby corrected as shown below:

<u>Column 16,</u>
Line 6, "selling" should be -- setting --.

Signed and Sealed this

Twentieth Day of June, 2006

JON W. DUDAS
*Director of the United States Patent and Trademark Office*